(12) United States Patent
Liu et al.

(10) Patent No.: US 7,041,383 B2
(45) Date of Patent: May 9, 2006

(54) DURABLE THERMAL BARRIER COATING HAVING LOW THERMAL CONDUCTIVITY

(75) Inventors: Yourong Liu, Hillsdale, NJ (US); Paul Lawton, Rock Hill, NY (US)

(73) Assignee: Chromalloy Gas Turbine Corporation, Orangeburg, NY (US)

( * ) Notice: Subject to any disclaimer, the term of this patent is extended or adjusted under 35 U.S.C. 154(b) by 0 days.

(21) Appl. No.: 10/835,667

(22) Filed: May 3, 2004

(65) Prior Publication Data

US 2005/0153158 A1 Jul. 14, 2005

Related U.S. Application Data

(63) Continuation-in-part of application No. 10/756,209, filed on Jan. 12, 2004.

(51) Int. Cl.
  B32B 15/04 (2006.01)
  F03B 3/12 (2006.01)
  C23C 14/22 (2006.01)

(52) U.S. Cl. .............. 428/632; 428/701; 428/702; 428/679; 427/596; 416/241 B

(58) Field of Classification Search ........... 428/632, 428/633, 697, 699, 701, 702, 336, 650, 655, 428/679, 680; 427/596, 255.319; 416/241 B; 501/102, 103, 126, 152
See application file for complete search history.

(56) References Cited

U.S. PATENT DOCUMENTS

| | | | |
|---|---|---|---|
| 5,687,679 A | 11/1997 | Mullin et al. | |
| 5,792,521 A | 8/1998 | Wortman | |
| 5,846,605 A | 12/1998 | Rickerby et al. | |
| 6,025,078 A | 2/2000 | Rickerby et al. | |
| 6,071,628 A | 6/2000 | Seals et al. | |
| 6,106,959 A | 8/2000 | Vance et al. | |
| 6,117,560 A | 9/2000 | Maloney | |
| 6,127,048 A | 10/2000 | Bele | |
| 6,177,200 B1 | 1/2001 | Maloney | |
| 6,183,884 B1 | 2/2001 | Rickerby | |
| 6,231,991 B1 | 5/2001 | Maloney | |
| 6,231,998 B1 | 5/2001 | Bowker et al. | |
| 6,258,467 B1 | 7/2001 | Subramanian | |
| 6,284,323 B1 | 9/2001 | Maloney | |
| 6,319,614 B1 | 11/2001 | Beele | |
| 6,365,281 B1 | 4/2002 | Subramanian et al. | |

(Continued)

FOREIGN PATENT DOCUMENTS

EP 0816526 10/2001

(Continued)

OTHER PUBLICATIONS

Khor, K.A.; and Yang, J., "Rapidly Solidfied Neodymia-Stabilised Zirconia Coatings Prepared by DC Plasma Spraying", Surface and Coatings Technology 96 (1997) 313-322.

(Continued)

Primary Examiner—Jennifer McNeil
(74) Attorney, Agent, or Firm—Mitchell Bittman

(57) ABSTRACT

This invention provides a thermal barrier ceramic coating for application to a metallic article, with the ceramic coating having a formula of $Nd_xZr_{1-x}O_y$ with Z dissolved in, where $0<x<0.5$ and $1.75<y<2$ and wherein Z is an oxide of a metal selected from the group consisting of Y, Mg, Ca, Hf and mixtures thereof. In one embodiment Nd is added at a level up to 7 mole %. In another embodiment Z is yttrium and is added at a level of at least 6 wt %.

48 Claims, 2 Drawing Sheets

U.S. PATENT DOCUMENTS

| | | | |
|---|---|---|---|
| 6,387,526 | B1 | 5/2002 | Beele |
| 6,387,539 | B1 | 5/2002 | Subramanian |
| 6,803,135 | B1 * | 10/2004 | Liu et al. .................... 428/701 |
| 6,858,334 | B1 | 2/2005 | Gorman et al. |
| 6,869,703 | B1 | 3/2005 | Spitsberg et al. |
| 6,875,529 | B1 | 4/2005 | Spitsberg et al. |
| 2002/0061416 | A1 | 5/2002 | Subramanian |
| 2004/0043244 | A1 | 3/2004 | Bruce et al. |

FOREIGN PATENT DOCUMENTS

| | | |
|---|---|---|
| WO | WO 01/18274 | 3/2001 |
| WO | WO 01/63008 | 8/2001 |

OTHER PUBLICATIONS

Zhu, Dongming; and Miller, Robert A.: Thermal Conductivity and Sintering Behavior of Advanced Thermal Barrier Coatings, NASA/TM-2202-211481, May 2002.

Zhu, Dongming; and Miller, Robert A.: Low Thermal Conductivity Thermal Barrier Coatings Developed, Jun. 25, 2003, web page: www.grc.nasa.gov.

P.G. Klemens, M. Gell, Thermal Conductivity of Thermal Barrier Coatings, Materials Science and Engineering A245 (1998) 14-149.

D. Chubb, A. Pal, Patton, P. Jenkins, Rare Earth Doped High Tempeature Ceramic Selective Emitters, NASA, Feb. 1-26, 1999.

H. Wang, RB Dinwiddie & PS Gaal, "Multiple Station Thermal Diffusivity Instrument", Thermal Conductivity 23, Proceedings of the 23rd International Thermal Conductivity Conference, p. 119-126, 1996.

U.S. Appl. No. 10/748,519 (f. Dec. 30, 2003) "Thermal Barrier Coating Having Lower Layer For Improved Adherence to Bond Coat", Darolia et al.

U.S. Appl. No. 10/748,517 (f. Dec. 30, 2003) "Ceramic Compositions For Thermal Barrier Coatings Stabilized in the Cubic Crystalline Phase", Boutwell et al.

U.S. Appl. No. 10/748,520 (f. Dec. 30, 2003) "Ceramic Compositions Useful In Thermal Barrier Coatings Having Reduced Thermal Conductivity", Splitsberg et al.

* cited by examiner

DURABLE THERMAL BARRIER COATING HAVING LOW THERMAL CONDUCTIVITY

This application is continuation-in-part of U.S. Ser. No. 10/756,209 filed Jan. 12, 2004 pending.

FIELD OF THE INVENTION

The present invention relates generally to the field of thermal barrier coatings that are used in elevated temperature applications such as gas turbine engines. In particular, this invention relates to a thermal insulating ceramic coating, which has a low thermal conductivity as well as a long service life, and to the metallic articles such as turbine components, (e.g. blades and vanes) that the coatings are applied to prevent the components from overheating during high temperature operation.

BACKGROUND OF THE INVENTION

Advanced gas turbine engines are continuously pursuing higher thrust and efficiency by the use of increased operating temperatures. However, the demand of increasing temperature is limited by the ability of most advanced nickel and cobalt based superalloy turbine blades and vanes to maintain their mechanical strength when exposed to the heat, oxidation, erosion and corrosion environment. Thus it is desirable to increase turbine engine operating temperatures, while decreasing the heat transfer to the metallic parts. One approach is to apply a thermal barrier coating onto the turbine blades and vanes to insulate the components from the high temperature operating environment. The ability of the thermal barrier coating to decrease the temperature to the metallic substrate depends upon the thermal conductivity of the thermal barrier coating. It is therefore desirable to develop thermal barrier coatings having low thermal conductivity to insulate effectively the thermal transfer to the components used in gas turbine engines, as well as providing a coated component having a long service life.

Efforts have been made to lower the thermal conductivity of thermal barrier coatings by modifying the chemistry and microstructure of current 7YSZ thermal barrier coating systems as disclosed in EP0816526A2, U.S. Pat. No. 6,071,628, U.S. Pat. No. 5,846,605, U.S. Pat. No. 6,183,884B1, U.S. Pat. No. 5,792,521, U.S. Pat. No. 5,687,679, W01/63008 and U.S. Pat. No. 6,284,323B1. These approaches decreased thermal conductivity of thermal barrier coatings to various extents with the minimum reported to be about half the thermal conductivity of typical 7 wt % yttria stabilized zirconia (7YSZ).

It is a main object of this invention to decrease thermal conductivity of thermal barrier coatings by providing a new ceramic material with low thermal conductivity. This invention also provides a method of applying such a thermal barrier coating system onto the metallic parts providing increased thermal insulation capability and prolonged durability, as well as increased erosion resistance.

BRIEF DESCRIPTION OF THE DRAWINGS

FIGS. 3(a) and 3(b) shows a protective ceramic top coat on the ceramic coating, $Nd_xZr_{1-x}O_y$ with Z dissolved in.

SUMMARY OF THE INVENTION

Figure 1:
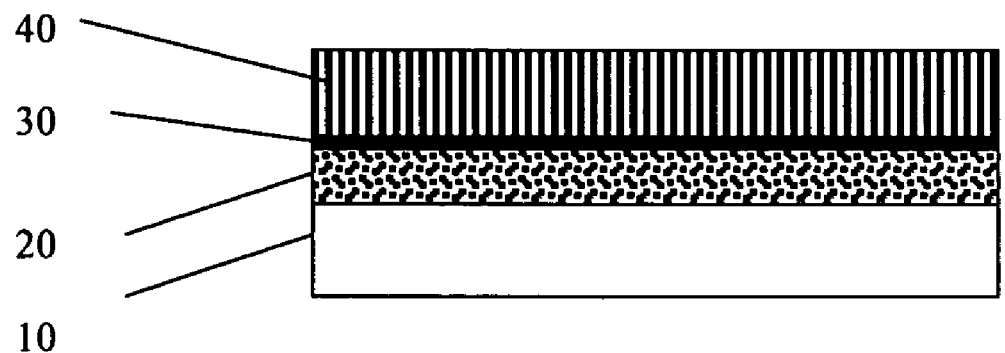
FIG. 1 shows the ceramic coating, $Nd_xZr_{1-x}O_y$ with Z dissolved in, which was applied by EBPVD onto a metallic bond coat

Briefly, this invention provides a thermal barrier ceramic coating for application to a metallic article, with the ceramic coating having a formula of $Nd_xZr_{1-x}O_y$ with Z dissolved in, where $0<x<0.5$ and $1.75<y<2$ and Z is an oxide of a metal selected from the group consisting of Y, Mg, Ca, Hf and mixtures thereof.

In a one embodiment up to 7 mole % of neodymia is in the coating. In another embodiment Z is yttria and at least 6 weight percent of yttria is added.

DETAILED DESCRIPTION OF THE INVENTION

This invention provides a thermal barrier ceramic coating having a formula of $Nd_xZ_{1-x}O_y$ with Z dissolved in, where $0<x<0.5$, $1.75<y<2$, and Z is an oxide of a metal selected from the group consisting of Y, Mg, Ca, Hf and mixtures thereof. The ceramic is formed by doping oxides of Nd and the selected metal oxides into a host zirconia ceramic forming a non-pyrochlore crystal structure. A preferred embodiment is where Z is yttria. The $Nd_xZr_{1-x}O_y$ ceramic coating with yttria dissolved in can be prepared by doping 2 to 15 mole % of $Nd_2O_3$, preferably up to 7 moles %. The yttria level generally is from 2 to 14 mole %, preferably at least 6 wt %. In a further embodiment along with the yttria, hafnium is also added, generally at a level of from about 0.5 to 6 wt %, preferably 1.5 to 4 wt %. The ceramic coating of this invention is applied to a metallic article providing a thermal barrier coating with low thermal conductivity, resistance to erosion and high resistance to cyclic oxidation providing increased durability.

In one preferred embodiment the coating contains up to 7 mole % of neodymia, e.g. 2 to 7 mole %. The lower level of neodymia is believed to provide a coating with increased erosion resistance. Higher levels of rare earth oxides provide thermal barrier coatings which spall earlier in cyclic oxidational testing. An example is a coating with 7 mole % of $Nd_2O_3$ and 5 mole % $Y_2O_3$ (8 wt %).

In another preferred embodiment the coating has at least 6 wt % of yttria, preferably 6 to 10 wt %, optimally 6 to 8 wt % dissolved in. The higher level of yttria is believed to provide a further reduction in thermal conductivity due to higher concentration of oxygen vacancies in the matrix lattice structure, which will enhance phonon scattering. In addition, a phase transformation from high temperature to ambient temperature was found in the system of Nd—Zr without yttria or with low levels of yttria which could cause premature spallation of the coatings. The addition of at least 6 wt % of yttria avoids the premature spallation caused by phase transformation in the TBC system. Another benefit of doping at least 6 wt % $Y_2O_3$ is to increase the toughness of the ceramic coatings material. Cracks were found within the ceramic coating without yttria or with low levels of yttria (less than 6 wt %) under thermal cycle impact. The tougher ceramic coating containing at least 6 wt % yttria also provides good erosion resistance. Thus the addition of at least 6 wt % yttria to the ceramic coating provides a coating with lower thermal conductivity and greater durability due to its improved phase stability, increased toughness, erosion resistance and resistance to cyclic oxidation. One example is a coating with 10 mole % of $Nd_2O_3$ and 6 wt % $Y_2O_3$ doped into $ZrO_2$. The further addition of hafnia along with yttria has the further advantage of reducing thermal conductivity and strengthening the ceramic material providing an increased resistance to erosion and thermal shock. An example is the further addition of about 3 wt % of hafnia (HfO$_2$) to the above example formulations.

The ceramic coating of this invention has a low thermal conductivity generally within the range of about 0.78 to 1.02 W/mK from 600° C. to 1100° C. This thermal conductivity is around 50% of the measured thermal conductivity of a typical 7YSZ coating (1.65–2.22 W/mK from 600° C. to 1100° C.). In addition the ceramic coating of this invention has a high resistance to cyclic oxidation.

Techniques for applying the ceramic coatings, $Nd_xZr_{1-x}O_y$, with Z dissolved in include air plasma thermal spray (APS), low pressure plasma spray (LPPS), high velocity oxygen fuel (HVOF), sputtering and electron beam physical vapor deposition (EBPVD), etc. In a preferred embodiment the ceramic coating is applied by electron beam physical vapor deposition (EBPVD) due to the columnar microstructure with inter-column gaps produced. The ceramic coating can be deposited as a straight columnar microstructure or a saw tooth microstructure or a layered microstructure or mix of thereof for further reduction in thermal conductivity. Generally, the ceramic coating is applied to a thickness within the range of about 5 to 500 μm, preferably about 25 to 400 μm. In a layered microstructure, the ceramic coating can have at least 2 layers, preferably from 5 to 100 layers, each at least about 1 μm thick, preferably about 5 to 25 μm thick.

The process of applying the ceramic coating by EBPVD is similar to that of applying 7YSZ in production. The evaporating source in a crucible is a solid ingot of the $Nd_xZr_{1-x}O_y$ with Z dissolved in, which is sintered zirconia doped with neodymia and the selected metal oxide. The layered microstructure of the ceramic coating, $Nd_xZr_{1-x}O_y$ with Z dissolved in, is applied by evaporating the solid ingots from two crucibles under controlled gun on/off program of electron beam physical vapor deposition. The ceramic coating, $Nd_xZr_{1-x}O_y$ with yttria dissolved in, with 6–8 wt % YSZ at the top is deposited by evaporating the solid ingot of $Nd_xZr_{1-x}O_y$ with Z dissolved in from one crucible and 6–8 wt % YSZ ingot from another crucible by electron beam physical vapor deposition.

For increased adhesion a metallic bond coat is applied onto the metallic article, such as a nickel or cobalt based superalloys prior to deposition of the ceramic coating. The metallic bond coat can be a MCrAlY alloy, wherein M is Ni, Co or mixtures thereof. Such alloys have a broad composition of 10 to 35% chromium, 5 to 15% aluminum, 0.01 to 1% yttrium, or hafnium, or lanthanum, with M being the balance. Minor amounts of other elements such as Ta or Si may also be present. The MCrAlY bond coat can be applied by EBPVD, though sputtering, low pressure plasma or high velocity oxy fuel spraying or entrapment plating may also be used.

Alternatively, the metallic bond coat can be comprised of an intermetallic aluminide such as nickel aluminide or platinum aluminide. The aluminide bond coating can be applied by standard commercially available aluminide processes whereby aluminum is reacted at the substrate surface to form an aluminum intermetallic compound, which provides a reservoir for the growth of an alumina scale oxidation resistant layer. Thus the aluminide coating is predominately composed of aluminum intermetallic [e.g., NiAl, CoAl and (Ni, Co) Al phase] formed by reacting aluminum vapor species, aluminum rich alloy powder or surface layer with the substrate elements in the outer layer of the superalloy component. This layer is typically well bonded to the substrate. Aluminizing may be accomplished by one of several conventional prior art techniques, such as, the pack cementation process, spraying, chemical vapor deposition, electrophoresis, sputtering, and appropriate diffusion heat treatments. Other beneficial elements can also be incorporated into diffusion aluminide coatings by a variety of processes. Beneficial elements include Pt, Pd, Si, Hf, Y and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility or incipient melting limits. In the specific case of platinum modified diffusion aluminide coating layers, the coating phases adjacent to the alumina scale will be platinum aluminide and/or nickel-platinum aluminide phases (on a Ni-base superalloy).

Through oxidation an alumina (i.e., aluminum oxide) layer is formed over the metallic bond coat. This alumina layer provides both oxidation resistance and a bonding surface for a ceramic coating. The alumina layer may be formed before the ceramic coating is applied, during application of the coating or subsequently by heating the coated article in an oxygen containing atmosphere at a temperature consistent with the temperature capability of the superalloy, or by exposure to the turbine environment. The sub-micron thick alumina scale will thicken on the aluminide surface by heating the material to normal turbine exposure conditions. The thickness of the alumina scale is preferably sub-micron (up to about one micron). The alumina layer may also be deposited by chemical vapor deposition following deposition of the metallic bond coat.

Alternatively, the metallic bond coat may be eliminated if the substrate is capable of forming a highly adherent alumina scale or layer. Examples of such substrates are very low sulfur (<1 ppm) single crystal superalloys, such as PWA 1487 and Rene N5, which also contain 0.1% yttrium to enhance adhesion of the thermally grown alumina scale.

FIG. 1 shows the ceramic coating, $Nd_xZr_{1-x}O_y$ with Z dissolved in, 40 which was applied by EBPVD onto a metallic bond coat 20, such as a MCrAlY and/or platinum modified aluminide. The bond coat 20 was applied to the metallic article 10, of nickel or cobalt based superalloys prior to the application of the ceramic coating 40. The bond coat 20 provides strong adhesion between the metallic substrate 10 and the ceramic coating 40. The ceramic coating adheres to the bond coat 20 through a thermally grown alumina film 30 on the bond coat 20.

Figure 2:
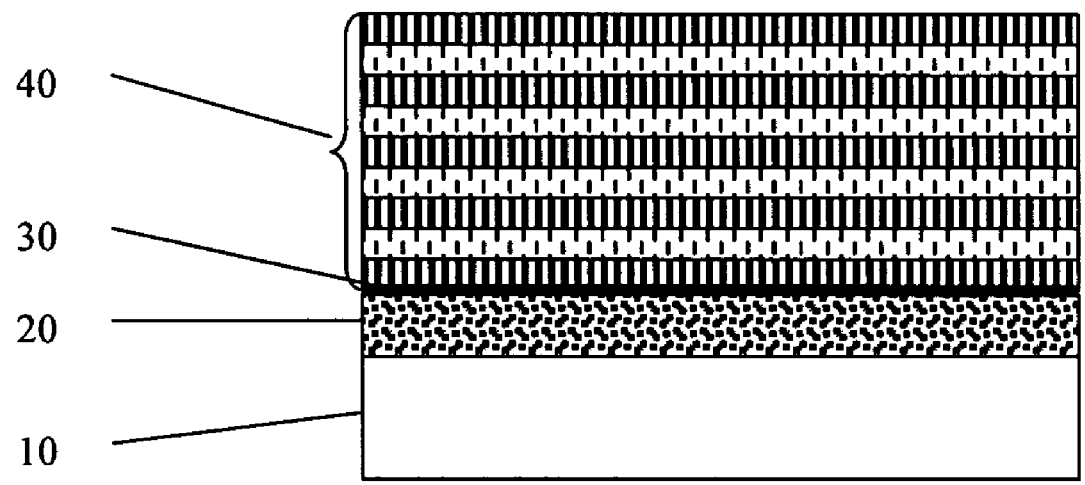
FIG. 2 shows the ceramic coating, $Nd_xZr_{1-x}O_y$ with Z dissolved in, applied in a layered microstructure.

FIG. 2 shows the ceramic coating, $Nd_xZr_{1-x}O_y$ with Z dissolved in, 40 applied in a layered microstructure. The interface boundaries between the layers are another potential source of phonon scattering for thermal conductivity reduction.

Figure 3:
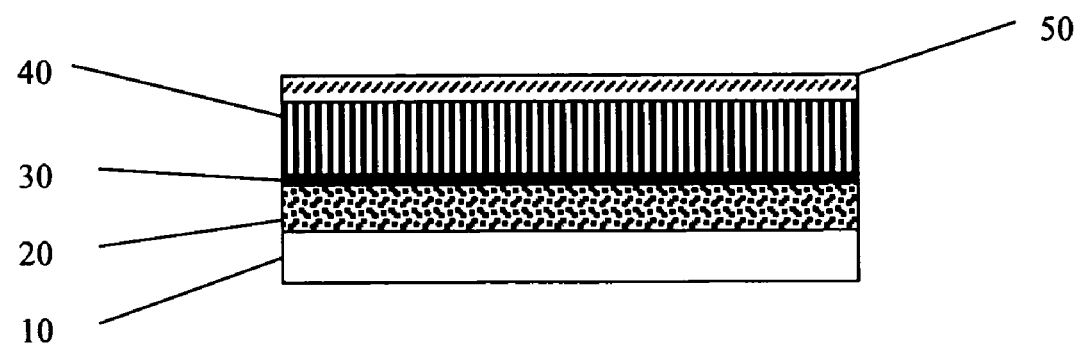
Figure 3:
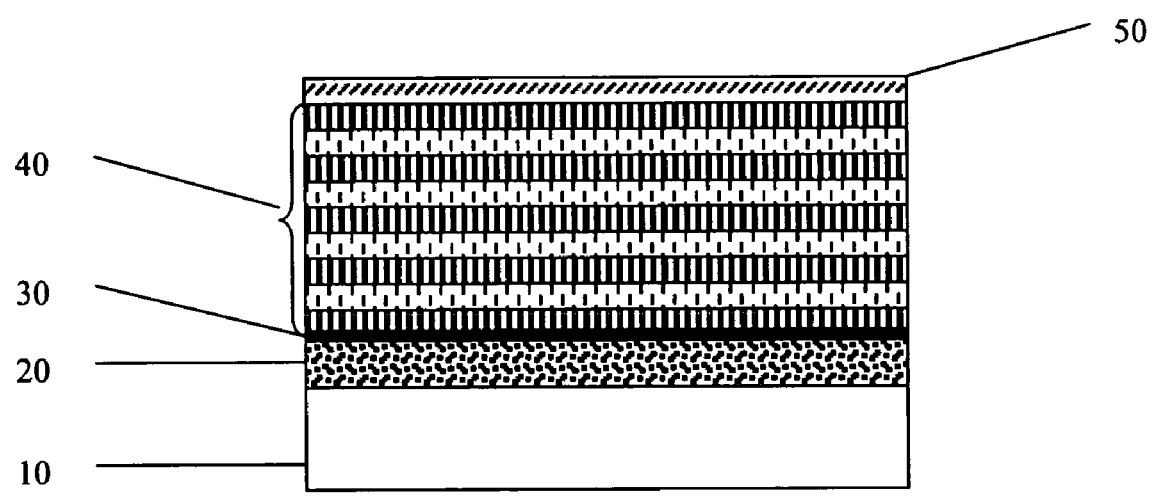

FIGS. 3(a) and 3(b) show a protective ceramic top coat 50 which is coated after the columnar ceramic coating $Nd_xZr_{1-x}O_y$ with Z dissolved in 40, to provide increased erosion resistance on the top surface which is subject to hot gas impact during turbine engine operation. This protective ceramic top coat can be a dense and/or wide column of ceramic coating $Nd_xZr_{1-x}O_y$ with Z dissolved in, or alternatively, layer 50 could also be 6–8 wt % YSZ. This protective ceramic top coat, 50 for erosion resistance, generally has a thickness of about 5 to 50 μm preferably about 10 to 25 μm thick. A protective top coat of 7YSZ with an appropriate thickness for erosion resistance on the ceramic coating, $Nd_xZr_{1-x}O_y$ with Z dissolved in, provides a thermal conductivity which is equivalent to the ceramic coating without the protective ceramic top coat.

The ceramic coating system of this invention provides many advantages for use in gas turbine engines. The reduction in thermal conductivity of 50 percent can reduce the thickness required for the thermal barrier coating (TBC) by approximately one half for the same degree of thermal insulation. This will lower the cost of the TBC due to the time saved in applying the coating, ingot material savings and energy savings in production. Decreasing in the coating thickness will also lower the weight of the gas turbine component, e.g. blades and vanes, which can provide a significant reduction in the weight of the disk that holds these components. Depositing the same thickness of the ceramic coating will allow an increased operating temperature to be achieved without overheating the metallic parts allowing the engine to operate a higher thrust and efficiency. The increased insulating capabilities of the ceramic coating could also reduce the requirements for air cooling the part.

This invention is generally applicable to any metallic article which uses thermal barrier coating system, and includes various modifications according to the principles of this invention.

What is claimed is:

1. A metallic article comprising a metallic substrate and a thermal barrier ceramic coating on its surface with the ceramic coating consisting essentially of a formula of $Nd_xZr_{1-x}O_y$ with yttria and hafnia added and dissolved in, where $0<x<0.5$ and $1.75<y<2$ with up to 7 moles % of $Nd_2O_3$ in the ceramic coating.

2. Article of claim 1 wherein with at least 6 wt % of yttria is added and dissolved in.

3. Article of claim 2 with 0.5 to 6 wt % hafnia is added and dissolved in.

4. Article of claim 2 with from 2 to 7 mole % of $Nd_2O_3$ and 6 to 10 wt % of yttria dissolved in.

5. Article of claim 4 with 1.5 to 4 wt % of hafnia is added and dissolved in.

6. Article of claim 5 with 7 mole % $Nd_2O_3$ and 5 mole % $Y_2O_3$ dissolved in.

7. Article of claim 5 with 10 mole % of $Nd_2O_3$ and 6 wt % $Y_2O_3$ added and dissolved in.

8. Article of claim 1 further comprising a metallic bond coat between the ceramic coating and the metallic substrate.

9. Article of claim 8 wherein the metallic bond coat is a MCrAlY, wherein M is selected from Ni and/or Co.

10. Article of claim 8 wherein the metallic bond coat is an intermetallic aluminide.

11. Article of claim 8 wherein the protective ceramic top coat has a thickness of about 5 to 50 μm.

12. Article of claim 1 wherein the ceramic coating has a columnar microstructure.

13. Article of claim 12 wherein the columnar microstructure is a straight or a saw tooth structure.

14. Article of claim 1 wherein the ceramic coating has a layered microstructure with interface boundaries between the layers.

15. Article of claim 1 further comprising a protective ceramic top coat overlaying the ceramic coating.

16. Article of claim 15 wherein the protective ceramic top coat is the ceramic coating with a dense columnar microstructure.

17. Article of claim 15 wherein the protective ceramic top coat is 6 to 8 wt % YSZ.

18. Article of claim 1 wherein the ceramic coating has a thermal conductivity of from about 0.78 to 1.02 W/mK from 600° C. to 1100° C.

19. Article of claim 1 wherein the ceramic coating has been applied by EBPVD, air plasma spray or HVOF.

20. Article of claim 1 wherein the metallic article is a turbine component.

21. Article of claim 20 wherein the turbine component has a metallic substrate of a nickel or cobalt based superalloy.

22. Article of claim 1 wherein the ceramic coating has a thickness within the range of about 5 to 500 μm.

23. A metallic article comprising a metallic substrate and a thermal barrier ceramic coating on its surface, the ceramic coating consisting essentially of a formula of $Nd_xZr_{1-x}O_y$ with yttria and hafnia added and dissolved in wherein $0<x<0.5$ and $1.75<y<2$, with at least 6 wt % of yttria dissolved in.

24. Article of claim 23 with 0.5 to 6 wt % hafnia is added and dissolved in.

25. Article of claim 23 having 6 to 10 wt % of yttria dissolved in and 2 to 15 mole % $Nd_2O_3$.

26. Article of claim 25 with 1.5 to 4 wt % of hafnia is added and dissolved in.

27. Article of claim 26 with 7 mole % $Nd_2O_3$ and 5 mole % $Y_2O_3$ dissolved in.

28. Article of claim 26 with 10 mole % of $Nd_2O_3$ and 6 wt % $Y_2O_3$ added and dissolved in.

29. Article of claim 23 wherein the ceramic has a non-pyrochlore crystal structure.

30. Article of claim 23 further comprising a metallic bond coat between the ceramic coating and the metallic substrate.

31. Article of claim 30 wherein the metallic bond coat is a MCrAlY, wherein M is selected from Ni and/or Co.

32. Article of claim 30 wherein the metallic bond coat is intermetallic aluminide.

33. Article of claim 23 wherein the ceramic coating has a columnar microstructure.

34. Article of claim 33 wherein the columnar microstructure is a straight or a saw tooth structure.

35. Article of claim 23 wherein the ceramic coating has a layered microstructure with interface boundaries between layers.

36. Article of claim 23 further comprising a protective ceramic top coat overlaying the ceramic coating.

37. Article of claim 36 wherein the protective ceramic top coat is the ceramic coating with a dense columnar microstructure.

38. Article of claim 36 wherein the protective ceramic top coat is 6–8 wt % YSZ having a thickness of about 5 to 50 μm.

39. Article of claim 23 wherein the ceramic coating has a thermal conductivity of from about 0.72 to 1.02 W/mK from 600° C. to 1100° C.

40. Article of claim 23 wherein the ceramic coating has been applied by EBPVD, air plasma spray or HVOF.

41. Article of claim 23 wherein the metallic article is a turbine component.

42. Article of claim 41 wherein the turbine component has a metallic substrate of a nickel or cobalt based superalloy.

43. A method for applying a thermal barrier ceramic coating to a metallic article comprising:

forming a ceramic consisting essentially of a formula $Nd_xZr_{1-x}O_y$ with yttria and hafnia added and dissolved in, wherein $0<x<0.5$ and $1.75<y<2$ with at least 6 wt % of yttria is added and dissolved in, by doping yttria, hafnia and neodymia into a zirconia ceramic; and applying the ceramic as a coating onto the metallic article.

44. Method of claim 43 wherein the ceramic is applied by electron beam physical vapor deposition.

45. Method of claim 43 with 0.5 to 6 wt % hafnia added and dissolved into a zirconia ceramic.

46. Method of claim 45 wherein 7 mole % of $Nd_2O_3$ and 5 mole % $Y_2O_3$ are doped into $ZrO_2$.

47. Article of claim 45 with 10 mole % of $Nd_2O_3$ and 6 wt % $Y_2O_3$ added and dissolved in.

48. Article of claim 47 with 1.5 to 4 wt % of hafnia added and dissolved in.

* * * * *